(12) United States Patent
Green et al.

(10) Patent No.: US 6,187,621 B1
(45) Date of Patent: *Feb. 13, 2001

(54) SEMICONDUCTOR PROCESSING METHODS OF FORMING CAPACITOR CONSTRUCTIONS AND SEMICONDUCTOR PROCESSING METHODS OF FORMING DRAM CONSTRUCTIONS

(75) Inventors: James E. Green, Caldwell; Darwin Clampitt, Boise, both of ID (US)

(73) Assignee: Micron Technology, Inc., Boise, ID (US)

( * ) Notice: Under 35 U.S.C. 154(b), the term of this patent shall be extended for 0 days.

This patent is subject to a terminal disclaimer.

(21) Appl. No.: 09/580,326

(22) Filed: May 26, 2000

Related U.S. Application Data

(63) Continuation of application No. 09/098,051, filed on Jun. 15, 1998, now Pat. No. 6,103,565, which is a continuation of application No. 08/591,226, filed on Jan. 18, 1996, now Pat. No. 5,773,341.

(51) Int. Cl.[7] ............................................... H01L 21/8234
(52) U.S. Cl. ......................... 438/238; 438/253; 438/254; 438/396; 438/397
(58) Field of Search .............................. 438/238, 253–4, 438/396, 397

(56) References Cited

U.S. PATENT DOCUMENTS

| | | | |
|---|---|---|---|
| 4,960,723 | 10/1990 | Davies | 437/41 |
| 5,061,650 | 10/1991 | Dennison et al. | 437/47 |
| 5,182,232 | 1/1993 | Chhabra et al. | 437/200 |
| 5,292,677 | 3/1994 | Dennison | 437/52 |
| 5,318,925 | 6/1994 | Kim | 437/195 |
| 5,338,700 | 8/1994 | Dennison et al. | 437/60 |
| 5,474,951 | 12/1995 | Han et al. | 437/60 |
| 5,491,356 | 2/1996 | Dennison et al. | 257/306 |
| 5,492,850 | 2/1996 | Ryou | 437/52 |
| 5,563,087 | 10/1996 | Jost et al. | 437/60 |
| 5,583,069 | 12/1996 | Ahn et al. | 437/52 |
| 5,604,147 | 2/1997 | Fischer et al. | 437/60 |
| 5,631,484 | 5/1997 | Tsoi et al. | 257/341 |
| 5,736,441 | 4/1998 | Chen | 438/255 |

FOREIGN PATENT DOCUMENTS 4-298073   10/1992   (JP) .

Primary Examiner—John F. Niebling
Assistant Examiner—Lynne A. Gurley
(74) Attorney, Agent, or Firm—Wells, St. John, Roberts, Gregory & Matkin, P.S.

(57) ABSTRACT

A semiconductor processing method of forming a capacitor construction includes, a) providing a pair of electrically conductive lines having respective electrically insulated outermost surfaces; b) providing a pair of sidewall spacers laterally outward of each of the pair of conductive lines; c) etching material over the pair of conductive lines between the respective pairs of sidewall spacers selectively relative to the sidewall spacers to form respective recesses over the pair of conductive lines relative to the sidewall spacers, the etching leaving the outermost conductive line surfaces electrically insulated; d) providing a node to which electrical connection to a capacitor is to be made between the pair of conductive lines, one sidewall spacer of each pair of sidewall spacers being closer to the node than the other sidewall spacer of each pair; e) providing an electrically conductive first capacitor plate layer over the node, the one sidewall spacers, and within the respective recesses; and f) providing a capacitor dielectric layer and a second capacitor plate layer over the first capacitor plate layer. In another aspect, a semiconductor processing method of processing relative to a conductive line includes, i) providing a pair of sidewall spacers laterally outward of an electrically conductive line; and ii) etching material over the conductive line between the sidewall spacers selectively relative to the sidewall spacers to form a recess over the conductive line relative to the sidewall spacers. Capacitor and conductive line constructions produced according to the above and other methods are also disclosed.

18 Claims, 7 Drawing Sheets

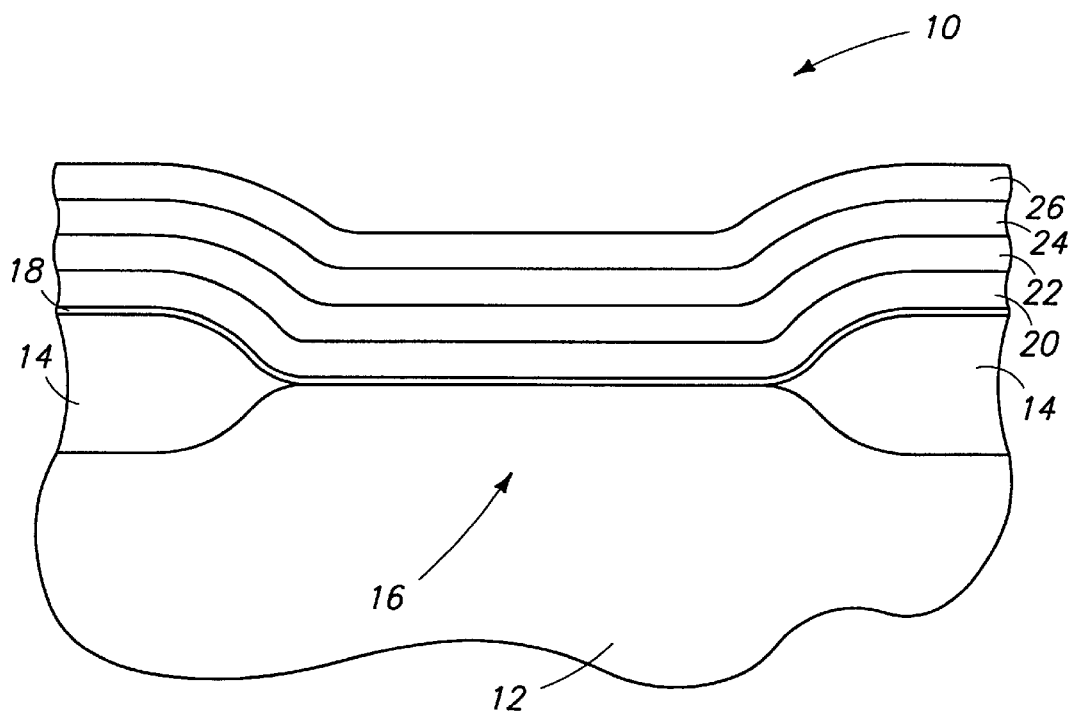
_Fig. 1_
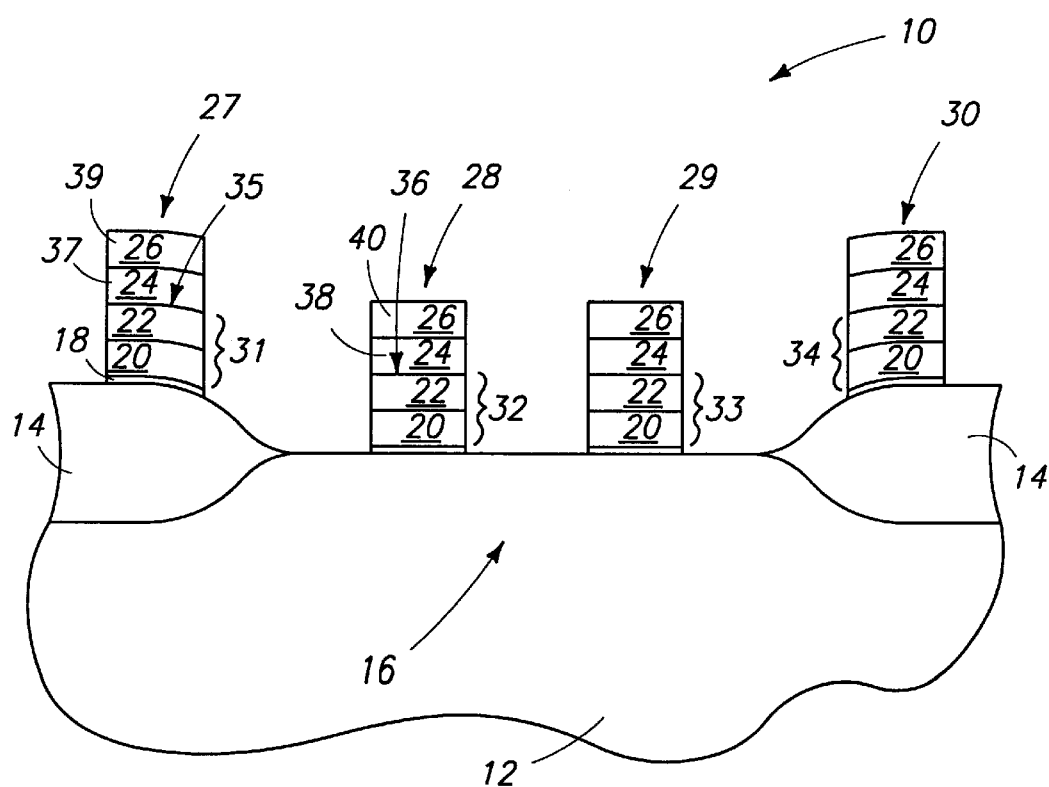
_Fig. 2_

SEMICONDUCTOR PROCESSING METHODS OF FORMING CAPACITOR CONSTRUCTIONS AND SEMICONDUCTOR PROCESSING METHODS OF FORMING DRAM CONSTRUCTIONS

RELATED PATENT DATA

This patent resulted from a continuation application of U.S. patent application Ser. No. 09/098,051, filed Jun. 15, 1998, entitled "Semiconductor Processing Methods of Forming Capacitors and Conductive Lines", naming James E. Green and Darwin A. Clampitt as inventors, now U.S. Pat. No. 6,103,565, the disclosure of which is incorporated by reference. U.S. patent application Ser. No. 09/098,051 resulted from a continuation application of U.S. patent application Ser. No. 08/591,226, filed Jan. 18, 1996, entitled "Method of Making Capacitor and Conductive Line Constructions", naming James E. Green and Darwin Clampitt as inventors, now U.S. Pat. No. 5,773,341, the disclosure of which is also incorporated by reference.

TECHNICAL FIELD

This invention relates to capacitor formation in semiconductor wafer processing, and to resultant capacitor constructions. The invention secondarily relates to conductive line formation in semiconductor wafer processing, and to resultant conductive line constructions.

BACKGROUND OF THE INVENTION

As DRAMs increase in memory cell density, there is a continuing challenge to maintain sufficiently high storage capacitance despite decreasing cell area. Additionally, there is a continuing goal to further decrease cell area.

The principal way of increasing cell capacitance is through cell structure techniques. Such techniques include three-dimensional cell capacitors, such as trenched or stacked capacitors. This invention concerns stacked capacitor cell constructions, including what are commonly known as crown or cylindrical container stacked capacitors. Aspects of the invention are also applicable to conductive line fabrication and resultant construction.

BRIEF DESCRIPTION OF THE DRAWINGS

Preferred embodiments of the invention are described below with reference to the following accompanying drawings.

FIG. 1 is a diagrammatic sectional view of a semiconductor wafer fragment at one processing step in accordance with the invention.

FIG. 2 is a view of the FIG. 1 wafer fragment at a processing step subsequent to that shown by FIG. 1.

DETAILED DESCRIPTION OF THE PREFERRED EMBODIMENTS

Figure 3:
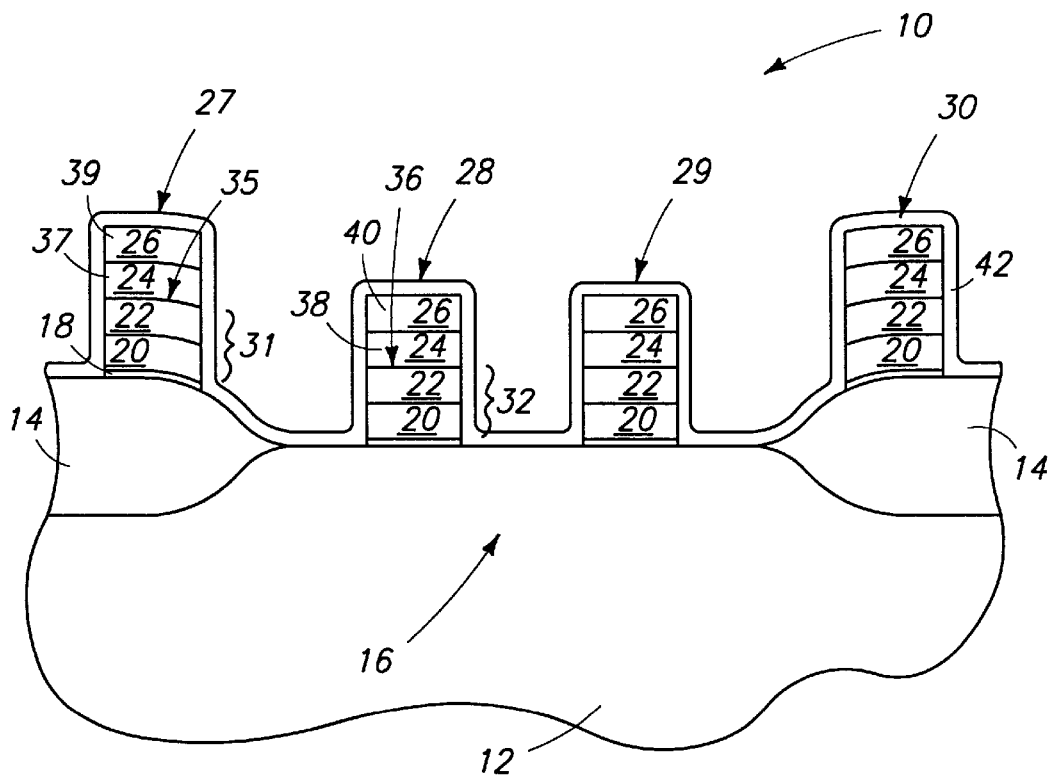
FIG. 3 is a view of the FIG. 1 wafer fragment at a processing step subsequent to that shown by FIG. 2.

This disclosure of the invention is submitted in furtherance of the constitutional purposes of the U.S. Patent Laws "to promote the progress of science and useful arts" (Article 1, Section 8).

In accordance with one aspect of the invention, a semiconductor processing method of forming a capacitor construction comprises the following steps:

providing a pair of electrically conductive lines having respective electrically insulated outermost surfaces;

providing a pair of sidewall spacers laterally outward of each of the pair of conductive lines;

etching material over the pair of conductive lines between the respective pairs of sidewall spacers selectively relative to the sidewall spacers to form respective recesses over the pair of conductive lines relative to the sidewall spacers, the etching leaving the outermost conductive line surfaces electrically insulated;

providing a node to which electrical connection to a capacitor is to be made between the pair of conductive lines, one sidewall spacer of each pair of sidewall spacers being closer to the node than the other sidewall spacer of each pair;

providing an electrically conductive first capacitor plate layer over the node, the one sidewall spacers, and within the respective recesses; and providing a capacitor dielectric layer and a second capacitor plate layer over the first capacitor plate layer.

In accordance with another aspect of the invention, a semiconductor processing method of processing relative to a conductive line comprises the following steps:

providing a pair of sidewall spacers laterally outward of an electrically conductive line; and etching material over the conductive line between the sidewall spacers selectively relative to the sidewall spacers to form a recess over the conductive line relative to the sidewall spacers.

Capacitor and conductive line constructions produced according to the above and other methods are also disclosed.

A semiconductor processing method of forming a capacitor construction is first described with reference to FIG. 1 where a semiconductor wafer in process is indicated generally with reference numeral 10. Such comprises a bulk monocrystalline silicon substrate 12 and electrically isolating field oxide regions 14. Active area 16 lies therebetween. A stack of layers is shown for formation of a plurality of electrically conductive gate lines for fabrication of DRAM circuitry. Specifically, a layer 18 comprises a gate oxide layer, and a layer 20 comprises conductively doped polysilicon, a layer 22 comprises a higher conductivity silicide, such as $WSi_x$. Example thicknesses for layers 18, 20 and 22 are 90 Angstroms, 1500 Angstroms, and 1200 Angstroms, respectively. First and second capping layers 24 and 26, respectively, are provided outwardly of silicide layer 22. Purposes thereof will be apparent subsequently. A preferred material for layer 24 is $Si_3N_4$, while a preferred material for layer 26 is undoped $SiO_2$. Example preferred thicknesses for layers 24 and 26 are 2000 Angstroms each. Although not shown, a thin layer of oxide (i.e., 350 Angstroms) would preferably also be provided between layers 22 and 24.

Referring to FIG. 2, the composite layers are collectively patterned to form the illustrated conductive line stacks 27, 28, 29 and 30. Such comprise respective conductive portions 31, 32, 33 and 34, with the remaining respective portions thereof in the preferred embodiment constituting electrically insulative material. The discussion proceeds with reference to electrically conductive line pairs 31 and 32. In the preferred embodiment, identical processing also occurs relative to conductive line pair 33 and 34, as will be apparent. Electrically conductive lines 31 and 32 have respective outermost surfaces 35 and 36 which are effectively insulated by first capping layer 24. The patterned capping layer 24 forms respective first electrically insulative caps 37 and 38 over outer surfaces 35 and 36, effectively providing electrical insulation thereof. Patterned second capping layer 26 defines respective second caps 39 and 40 over first caps 37 and 38, respectively. Second caps 39 and 40 are preferably chosen to comprise a material which is selectively etchable relative to that of first caps 37 and 38.

Referring to FIG. 3, an electrically insulative spacer layer 42 is deposited. An example and preferred material is $Si_3N_4$ deposited to an example thickness of 700 Angstroms.

Figure 4:
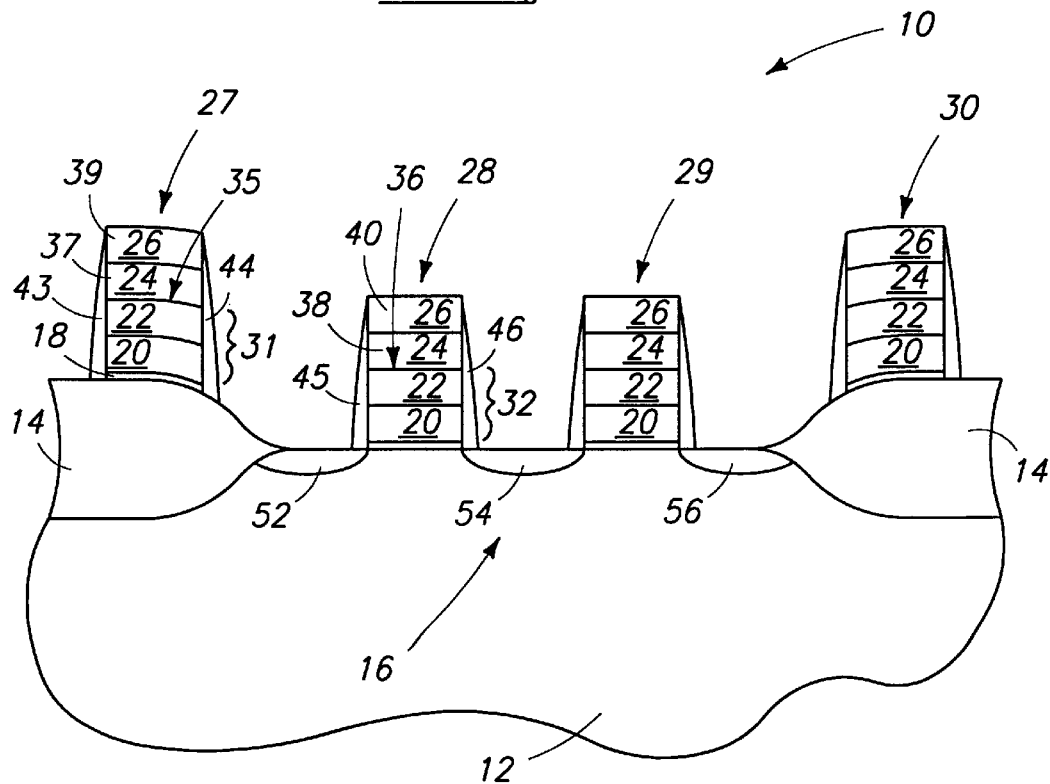
FIG. 4 is a view of the FIG. 1 wafer fragment at a processing step subsequent to that shown by FIG. 3.

Referring to FIG. 4, the spacer layer 42 is anisotropically etched to provide a pair of sidewall spacers 43, 44 laterally outward of conductive line 31, first cap 37 and second cap 39, and also a pair of sidewall spacers 45 and 46 laterally outward of conductive line 32, first cap 38 and second cap 40. The material of second caps 39 and 40 is advantageously chosen to be selectively etchable relative to sidewall spacers 43, 44, 45 and 46. Most preferred, first caps 37 and 38 are chosen to constitute the same predominant $Si_3N_4$ material as spacers 43, 44, 45 and 46.

Diffusion regions 52, 54 and 56 are at some point provided relative to bulk substrate 12, as shown. Region 54 comprises a shared bit contact node for a bit line in accordance with fabrication of a DRAM array, whereas diffusion regions 52 and 56 constitute respective nodes to which electrical connection to a capacitor is to be made. Thus with respect to the above continuing discussion, diffusion region 52 constitutes a capacitor connection node provided between pair of conductive lines 31 and 32. The sidewall spacers 44 and 45 of each of the two described pairs of sidewall spacers are closer to node 52 than the other sidewall spacers 43 and 46 of each respective pair.

Figure 5:
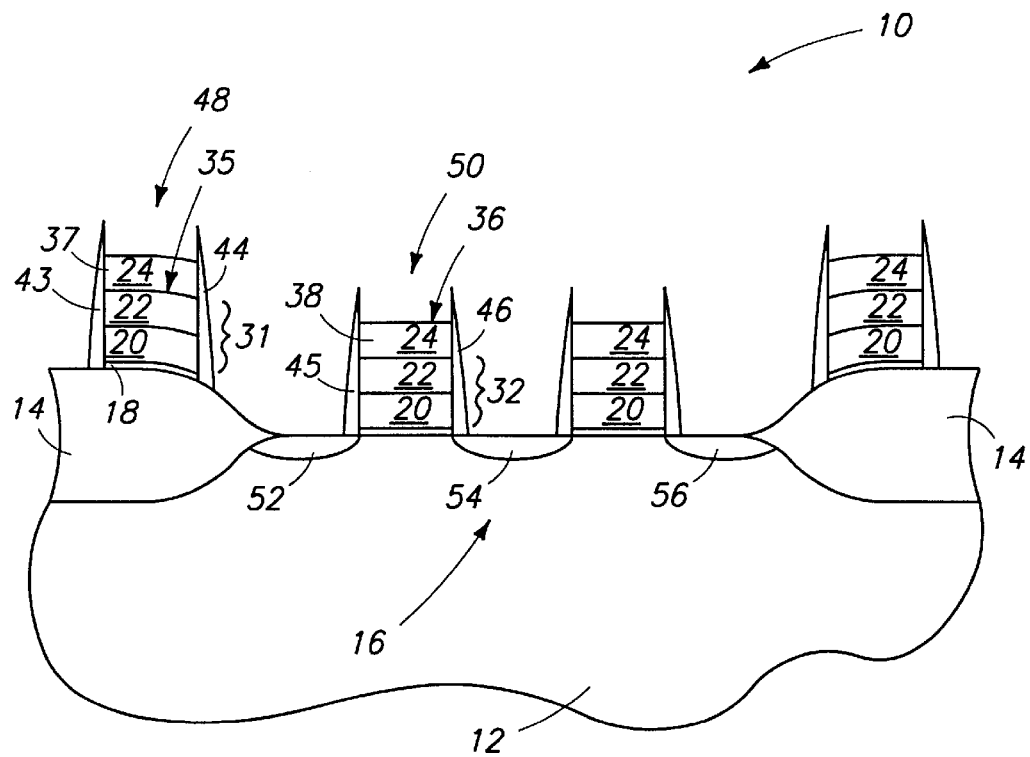
FIG. 5 is a view of the FIG. 1 wafer fragment at a processing step subsequent to that shown by FIG. 4.

Referring to FIG. 5, second caps 39 and 40 are etched between the respective pairs of sidewall spacers 43, 44 and 45, 46, and selectively relative to first caps 37 and 38 to form recesses 48 and 50 over the pair of conductive lines 31 and 32, respectively, relative to sidewall spacers 43, 44 and 45, 46, respectively. Thus, material is etched over the pair of conductive lines between the respective spacers, which in the preferred embodiment comprises an electrically insulative material of $SiO_2$. Further, outermost conductive line surfaces 35 and 36 remain electrically insulated by material 24 after the etching step.

Figure 6:
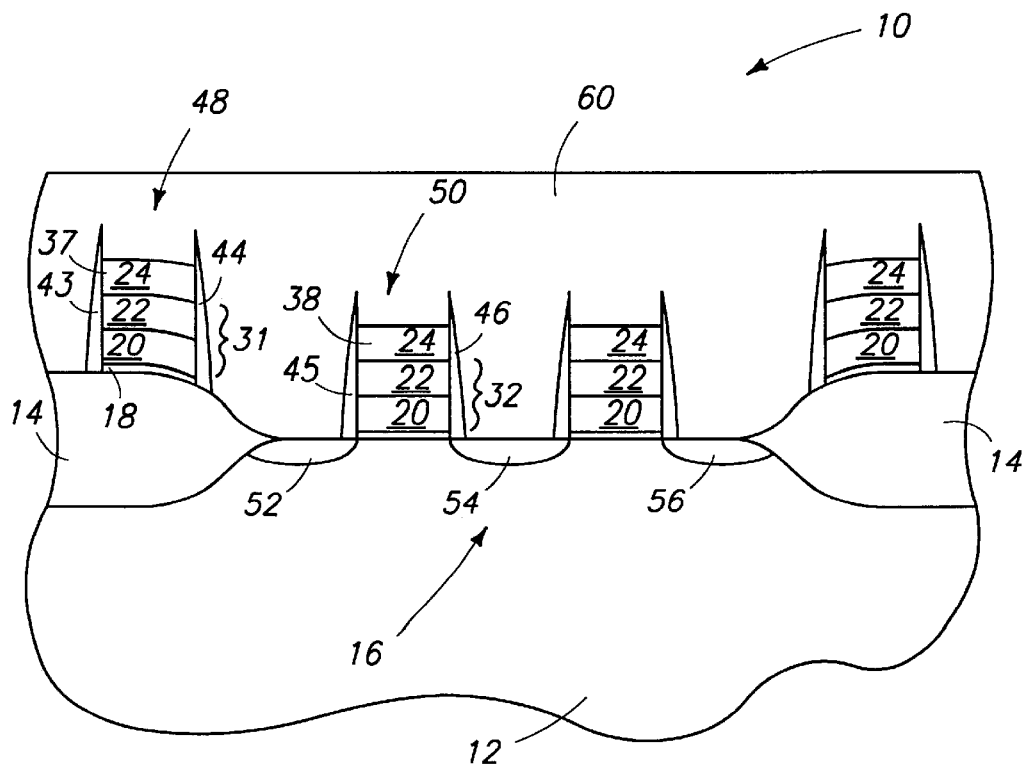
FIG. 6 is a view of the FIG. 1 wafer fragment at a processing step subsequent to that shown by FIG. 4.

Referring to FIG. 6, an electrically insulating layer 60 is deposited and planarized outwardly relative to conductive lines 31 and 32, and within recesses 48 and 50. An example and preferred material for layer 60 is borophosphosilicate glass (BPSG).

Figure 7:
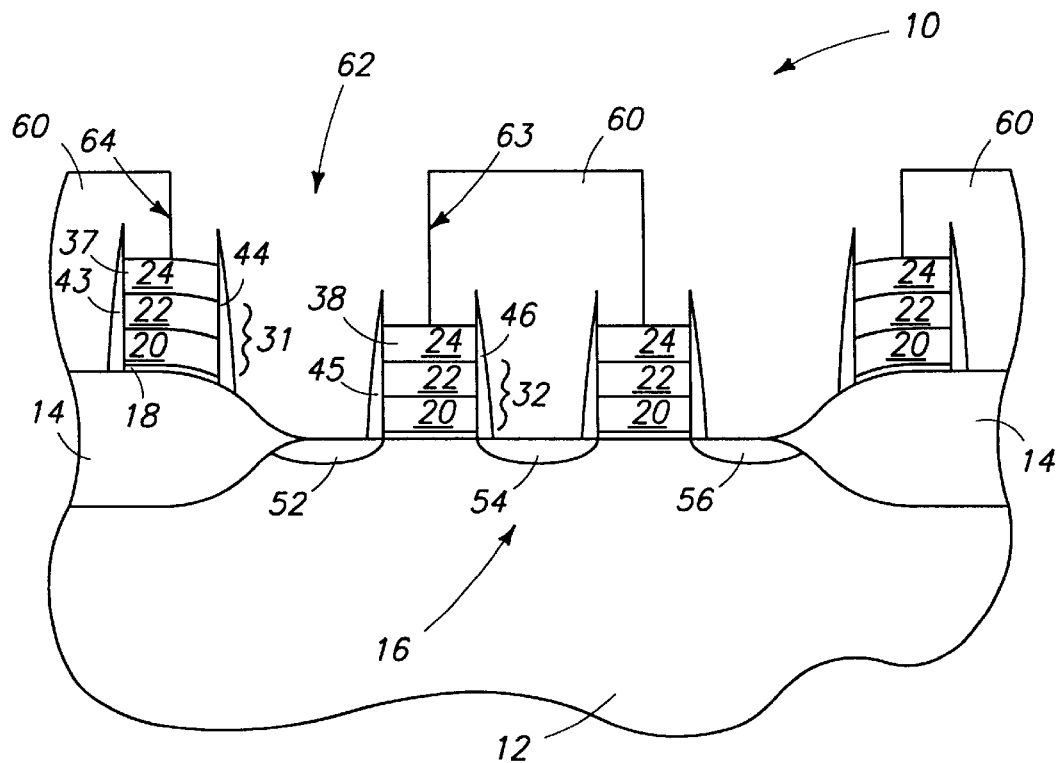
FIG. 7 is a view of the FIG. 1 wafer fragment at a processing step subsequent to that shown by FIG. 6.

Referring to FIG. 7, insulating layer 60 is patterned and etched to define a capacitor container opening 62 therethrough relative to node 52. Capacitor opening 62 is patterned to have a pair of outer lateral sidewalls 63 and 64. Lateral sidewall 63 is positioned or received within the lateral confines of sidewall spacers 45 and 46, while lateral sidewall 64 is positioned or received within the lateral confines of sidewall spacers 43 and 44.

Figure 8:
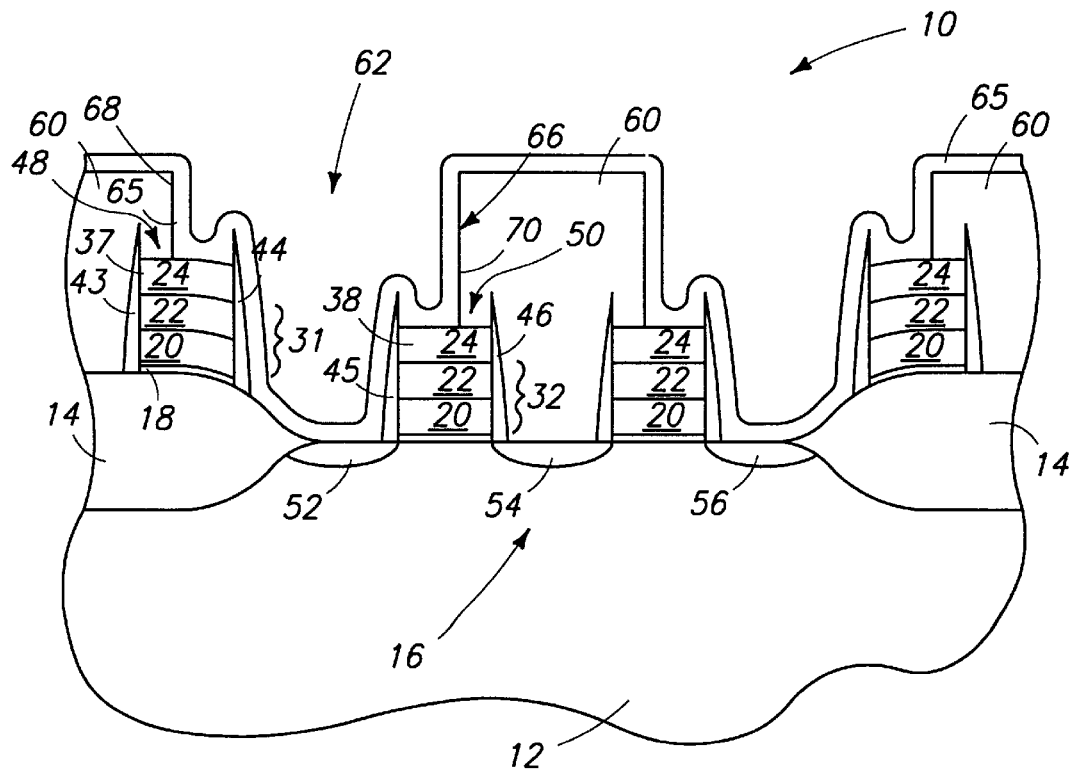
FIG. 8 is a view of the FIG. 1 wafer fragment at a processing step subsequent to that shown by FIG. 7.

Referring to FIG. 8, an electrically conductive capacitor plate layer 65 is deposited over electrically insulating layer 60 and within capacitor opening 62, and accordingly over node 52, at least the one sidewall spacers 44 and 45 and within respective recesses 48 and 50. A preferred composition for layer 65 is conductively doped polysilicon.

Figure 9:
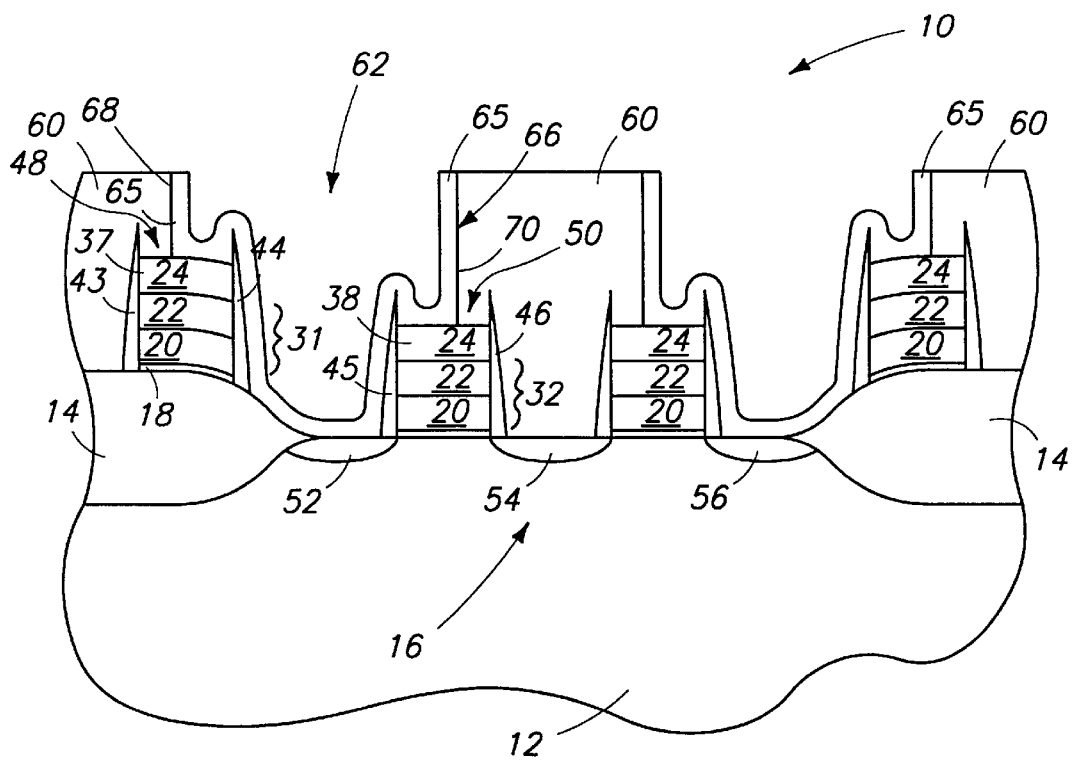
FIG. 9 is a view of the FIG. 1 wafer fragment at a processing step subsequent to that shown by FIG. 8.

Referring to FIG. 9, layer 65 is preferably chemical-mechanical polished (CMPed) to effectively define a first capacitor plate 66 effectively in the shape of a container. The recessing or etching of material between the illustrated sidewall spacers effectively results in layer 65 serpentining thereover, thus increasing surface area over that which would otherwise occur were such recesses not provided. Further in accordance with the preferred process, container 66 effectively includes sidewalls 68 and 70 which effectively project outwardly relative to conductive lines 31 and 32 within the lateral confines of respective recesses 48 and 50 between pairs of sidewall spacers 43, 44 and 45, 46, respectively.

Figure 10:
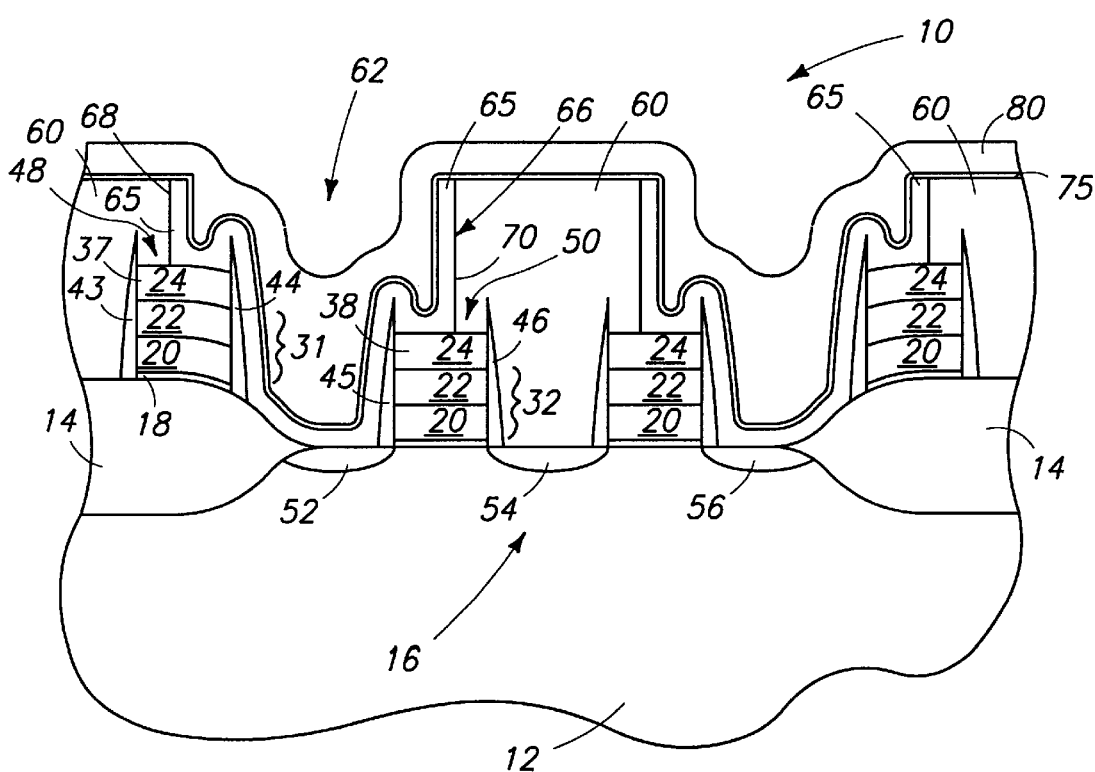
FIG. 10 is a view of the FIG. 1 wafer fragment at a processing step subsequent to that shown by FIG. 9.

Referring to FIG. 10, a capacitor dielectric layer 75 and a second capacitor plate layer 80 are provided over patterned first capacitor plate 65/66. A preferred material for layer 75 is an oxide, an ONO composite or a ferroelectric material. Layer 80 preferably constitutes conductively doped polysilicon. Processing would typically proceed in the fabrication of a DRAM array by patterning and isolating a contact opening through layers 80 and 75 over and to node 54. The opening would then be preferably separately plugged with tungsten. Subsequently, an electrically conductive layer would be deposited and patterned for fabrication of a bit line which ohmically connects with the plug.

Although the invention primarily spawned from concerns associated with maximizing capacitance in a capacitor construction, the artisan will appreciate applicability of the invention relative to fabrication of and resultant electrically conductive lines apart from capacitor fabrication.

The above described embodiment etched capping layer 26/caps 39, 40 without any masking of such capping material between the respective pairs of sidewall spacers. An alternate and preferred embodiment whereby some of said material between the respective pairs of sidewall spacers is masked during etching is described during with reference to FIGS. 11–13. Like numerals from the first described embodiment are utilized where appropriate, with differences being indicated by the suffix "b" or with different numerals.

Figure 11:
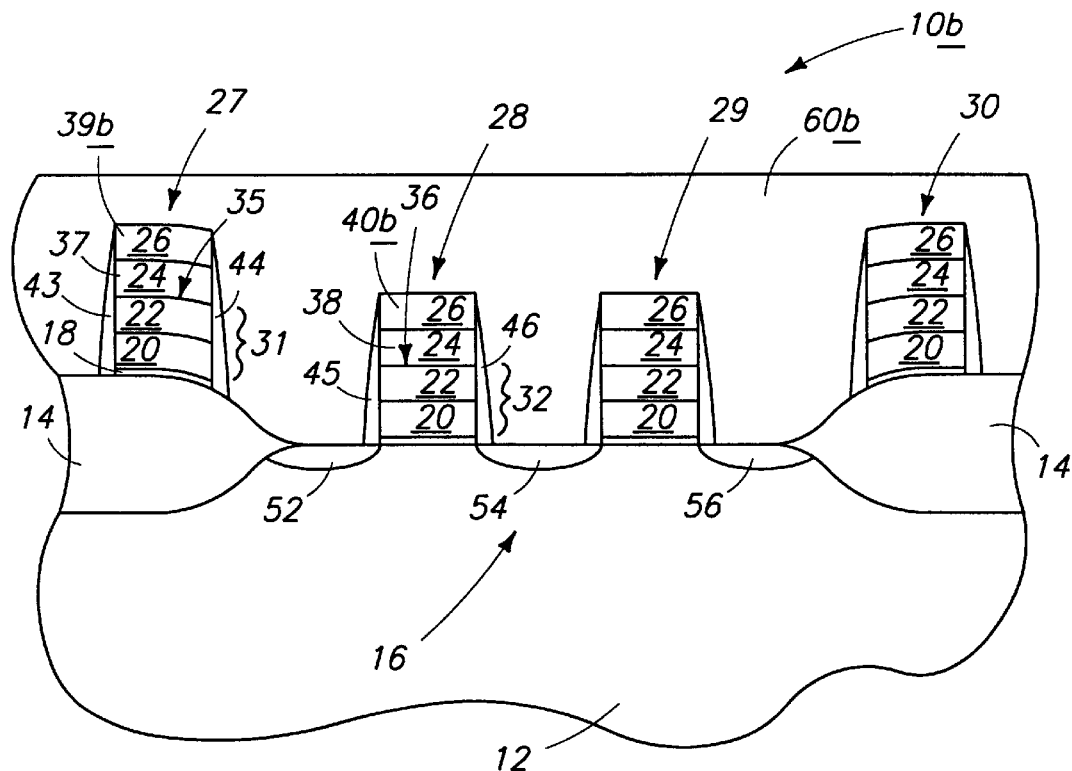
FIG. 11 is an alternate embodiment view of the FIG. 1 wafer fragment at an alternate embodiment processing step subsequent to that shown by FIG. 4.

FIG. 11 illustrates a wafer fragment 10b shown at a processing step subsequent to that depicted by FIG. 4 of the first described embodiment. Here, second capping layer 26/caps 39, 40 are not etched selectively relative to the sidewall spacers prior to provision of planarized electrically insulating layer 60b.

Figure 12:
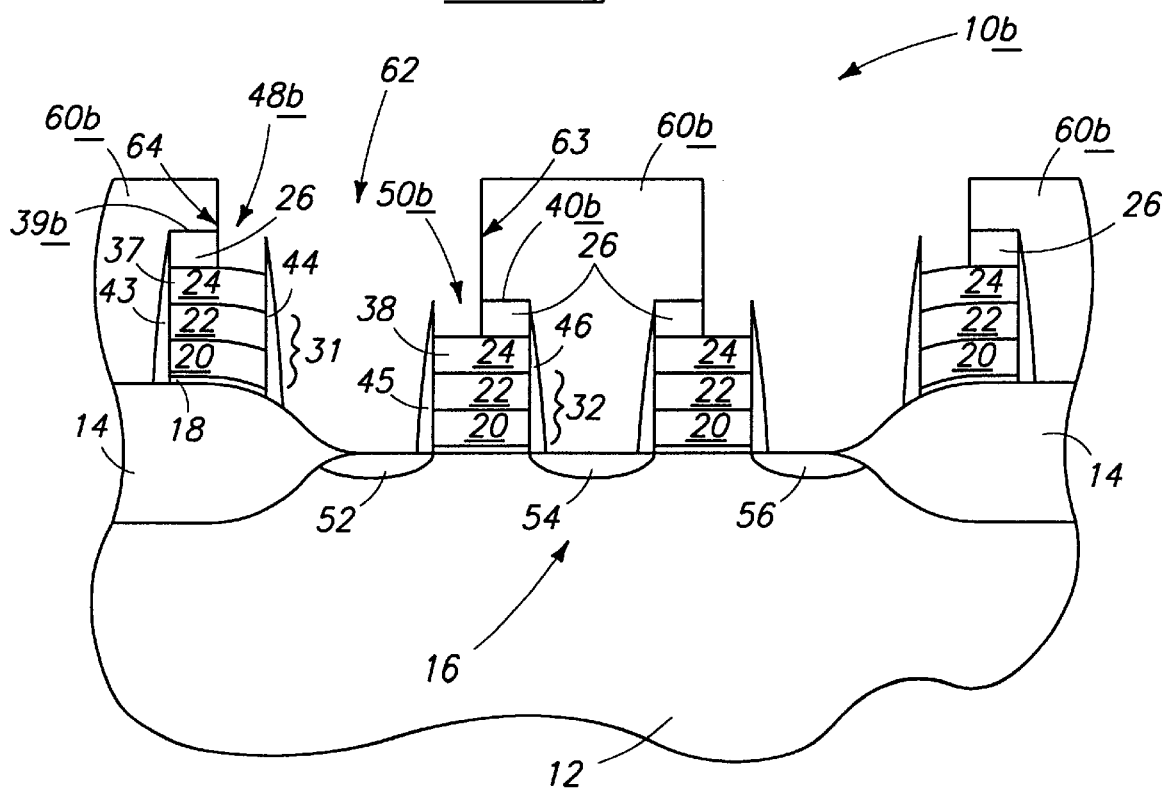
FIG. 12 is a view of the FIG. 11 wafer fragment at a processing step subsequent to that shown by FIG. 11.

Referring to FIG. 12, the mask and etching utilized to produce capacitor container opening 62 also comprises etching of material 26 to produce recesses 48b and 50b in the same essential step utilized to produce the capacitor container opening. Thus in the first described embodiment, recesses 48 and 50 extend completely across the respective conductive lines between the respective sidewall spacers. In the FIGS. 11–13 embodiment, recesses 48b and 50b extend only partially across the respective lines between the respective sidewall spacers.

Figure 13:
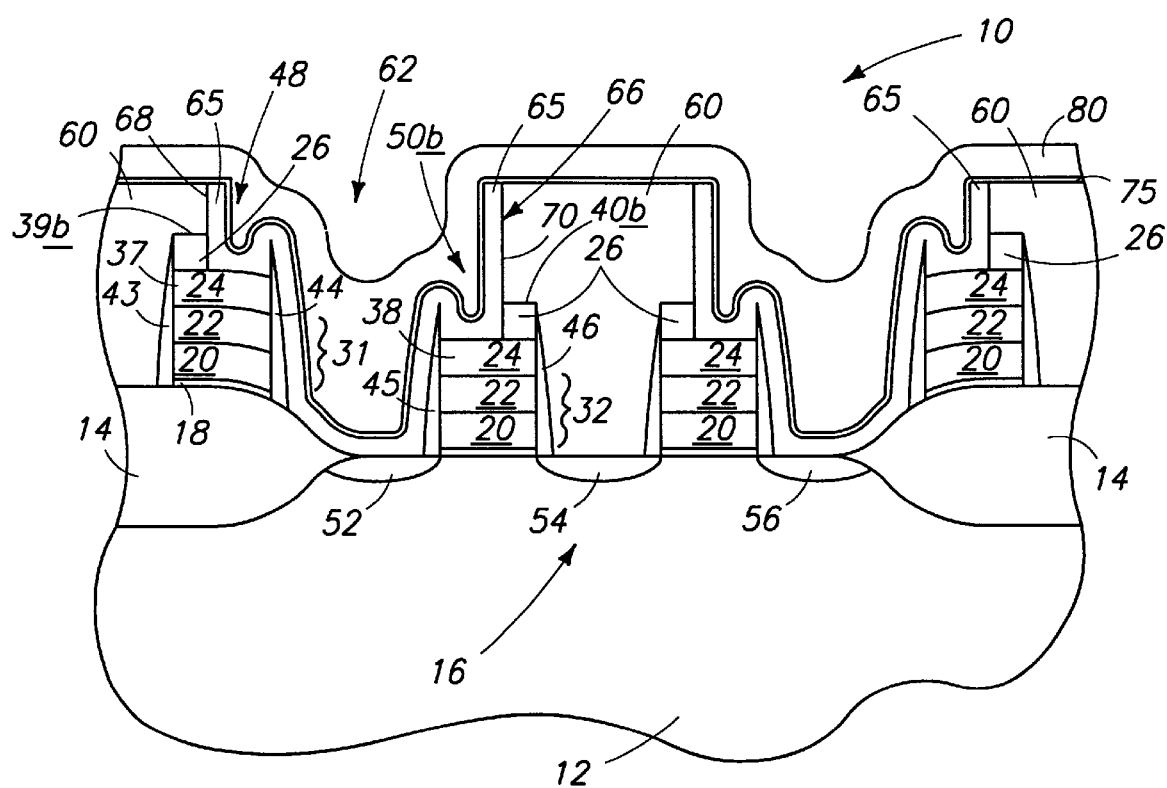
FIG. 13 is a view of the FIG. 11 wafer fragment at a processing step subsequent to that shown by FIG. 12.

FIG. 13 illustrates resultant patterning to produce the same essential construction as the first described embodiment, but for remaining second caps 39*b* and 40*b* spanning only a portion of the line width, and thus providing a gap between the respective inner sidewall spacers and the respective cap 39*b* or 40*b*.

This second described embodiment is preferred over the first described embodiment in leaving gate oxide over the substrate area, such as the area over diffusion region 54, until such time as the substrate area is exposed for electrical contact therewith.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A semiconductor processing method of forming a capacitor construction, comprising:
   providing an electrically conductive line over a semiconductive substrate;
   providing a pair of sidewall spacers laterally adjacent the conductive line, the spacers having uppermost surfaces;
   forming a recess over the conductive line and extending to beneath the uppermost surfaces of the sidewall spacers;
   providing a node to which electrical connection to a capacitor is to be made proximate the conductive line, the node comprising a diffusion region in the semiconductive substrate;
   forming an electrically conductive first capacitor plate layer over the node, and over one sidewall spacer of the pair of side wall spacers and not the other sidewall spacer of the pair of sidewall spacers, and within the recess; the first capacitor plate layer contacting a surface of the semiconductive substrate at the node to contact the diffusion region of the node; and
   providing a capacitor dielectric layer and a second capacitor plate layer over the first capacitor plate layer.

2. A semiconductor processing method of forming a capacitor construction, comprising:
   providing a pair of electrically conductive lines over a semiconductive substrate;
   providing a pair of sidewall spacers laterally adjacent the pair of conductive lines, the spacers having uppermost surfaces;
   etching material over the conductive lines between respective pairs of sidewall spaces to form respective recesses over the pair of conductive lines and extending to beneath the uppermost surfaces of the sidewall spacers;
   providing a node to which electrical connection to a capacitor is to be made between the pair of conductive lines, one sidewall spacer of each pair of sidewall spacers being closer to the node than the other sidewall spacer of each pair, the node comprising a diffusion region in the semiconductive substrate;
   forming an electrically conductive first capacitor plate layer over the node, over the one sidewall spacer of each pair of sidewall spacers and not the other sidewall spacer of each pair of sidewall spacers, and within the respective recesses, the first capacitor plate layer contacting a surface of the semiconductive substrate at the node to contact the diffusion region of the node; and
   providing a capacitor dielectric layer and a second capacitor plate layer over the first capacitor plate layer.

3. The semiconductor processing method of claim 2 wherein the semiconductive substrate is a silicon-comprising wafer.

4. The semiconductor processing method of claim 2 wherein the recesses do not extend to conductive portions of the conductive lines.

5. The semiconductor processing method of claim 2 wherein the etching is conducted without masking any of said material between the respective pairs of sidewall spacers.

6. The semiconductor processing method of claim 2 wherein the etching is conducted with some of said material between the respective pairs of sidewall spacers being masked.

7. The semiconductor processing method of claim 2 wherein the material etched over the pair of conductive lines between the respective pair of spacers comprises electrically insulative material.

8. The semiconductor processing method of claim 2 wherein the step of providing the first capacitor plate layer comprises:
   after the etching step, providing an electrically insulating layer outwardly of the conductive lines and within the recesses;
   patterning and etching the insulating layer to define a capacitor container opening therethrough over the node; and
   depositing the electrically conductive capacitor plate layer over the electrically insulating layer and within the capacitor opening.

9. The semiconductor processing method of claim 8 wherein the capacitor opening is patterned to have a pair of outer lateral sidewalls, each lateral sidewall of the pair being positioned between a respective one of the pairs of sidewall spacers.

10. The semiconductor processing method of claim 8 wherein the material etched over the pair of conductive lines between the respective pair of spacers comprises electrically insulative material.

11. The semiconductor processing meted of claim 2 wherein the step of providing the first capacitor plate layer comprises:
    providing an electrically insulating layer outwardly of the conductive lines;
    patterning and etching the insulating layer to define a capacitor container opening therethrough over the node; and the capacitor opening being patterned to have a pair of outer lateral sidewalls, each lateral sidewall of the pair being positioned between a respective one of the pairs of sidewall spacers, the etching of said material to form the recesses and the etching of the insulating layer being conducted in the same etching step; and
    depositing the electrically conductive capacitor plate layer over the electrically insulating layer and within the capacitor opening.

12. A semiconductor processing method of forming a capacitor construction comprising the following steps:
    forming a first electrically conductive line over a semiconductive substrate;

forming one pair of sidewall spacers beside the first conductive line and the one pair of sidewall spacers having at least one inner lateral surface against the first conductive line, the one inner lateral surface extending upwardly beyond the first conductive line and comprising an exposed portion above the first conductive line;

providing a node to which electrical connection to a capacitor is to be made, the node being a diffusion region within the semiconductive substrate;

providing an electrically conductive first capacitor plate layer over the node, and over one sidewall spacer of the one pair of sidewall spacers and not over the other sidewall spacer of the one pair of sidewall spacers; the first capacitor plate layer contacting the exposed portion of the one sidewall spacer inner lateral surface and contacting a surface of the semiconductor substrate at the node; and providing a capacitor dielectric layer and a second capacitor plate layer over the first capacitor plate layer.

13. The semiconductor processing method of claim 12 wherein the semiconductive substrate is a silicon wafer.

14. A semiconductor processing method of forming a DRAM construction comprising the following steps:

forming four electrically conductive lines over a semiconductive substrate, the four lines being spaced from one another;

forming four pairs of sidewall spacers beside the four conductive lines with each pair of sidewall spacers in a one-to one relationship with the lines, individual sidewall spacers having inner lateral surfaces against individual conductive lines, the inner lateral surfaces extending upwardly beyond the conductive lines and comprising exposed portions above the conductive lines;

providing a pair of nodes to which electrical connection to capacitors is to be made, the nodes being between different pairs of the four conductive lines;

providing an electrically conductive first capacitor plate layer over the nodes, and over one individual sidewall spacer of each pair of sidewall spacers and not over the other individual sidewall spacer of each pair of sidewall spacers; the first capacitor plate layer contacting the exposed portions of the four sidewall spacers inner lateral surfaces; and providing a capacitor dielectric layer and a second capacitor plate layer over the first capacitor plate layer.

15. The method of claim 14 wherein the node is a diffusion region in the semiconductive substrate and wherein the first capacitor plate layer contacts the semiconductive substrate at the node.

16. A semiconductor processing method of forming a DRAM construction, comprising:

providing four electrically conductive lines over a semiconductive substrate;

providing four pairs of sidewall spacers laterally adjacent the conductive lines, the spacers having uppermost surfaces and each pair of spacers being in a one-to-one relationship with the lines;

forming respective recesses over the conductive lines and extending to beneath the uppermost surfaces of the sidewall spacers;

providing a pair of nodes to which electrical connection to capacitors is to be made between the conductive lines, the nodes being between different pairs of the four conductive lines;

forming an electrically conductive first capacitor plate layer over the nodes, and over one sidewall spacer of each pair of sidewall spacers and not the other sidewall spacer of each pair of sidewall spacers; and within the respective recesses; and providing a capacitor dielectric layer and a second capacitor plate layer over the first capacitor plate layer.

17. The method of claim 16 wherein the node is a diffusion region in the semiconductive substrate and wherein the first capacitor plate layer contacts the semiconductive substrate at the node.

18. A semiconductor processing method of forming a capacitor construction, comprising:

providing an electrically conductive line over a semiconductive substrate, the line having an electrically insulative first cap thereover, and a second cap over the first cap;

providing a pair of sidewall spacers, first and second sidewall spacers of the pair of sidewall spacers laterally adjacent the conductive line and the first and second caps, the first and second sidewall spacers having uppermost surfaces;

removing at least a portion of the second cap to form a recess over the conductive line and extending to beneath the uppermost surfaces of the first and second sidewall spacers;

providing a node to which electrical connection to a capacitor is to be made proximate the conductive line, the node comprising a diffusion region in the semiconductive substrate;

forming an electrically conductive first capacitor plate layer over the node, and over the first sidewall spacer and not over the second sidewall spacer, and within the recess; the first capacitor plate layer contacting a surface of the semiconductive substrate at the node to contact the diffusion region of the node; and providing a capacitor dielectric layer and a second capacitor plate layer over the first capacitor plate layer.

* * * * *

UNITED STATES PATENT AND TRADEMARK OFFICE
CERTIFICATE OF CORRECTION

PATENT NO. : 6,187,621 B1
DATED : February 13, 2001
INVENTOR(S) : James E. Green et al.

Page 1 of 1

It is certified that error appears in the above-identified patent and that said Letters Patent is hereby corrected as shown below:

<u>Column 6,</u>
Line 47, replace "meted" with -- method --.
Line 54, replace "node; and the" with -- node, the --.

Signed and Sealed this

Twenty-fifth Day of September, 2001

Attest:

*Nicholas P. Godici*

NICHOLAS P. GODICI
*Attesting Officer*   *Acting Director of the United States Patent and Trademark Office*